(12) United States Patent
Tu

(10) Patent No.: US 6,342,419 B1
(45) Date of Patent: *Jan. 29, 2002

(54) DRAM CAPACITOR AND A METHOD OF FABRICATING THE SAME

(75) Inventor: Yeur-Luen Tu, Taichung (TW)

(73) Assignee: Taiwan Semiconductor Manufacturing Co., Ltd. (TW)

(*) Notice: Subject to any disclaimer, the term of this patent is extended or adjusted under 35 U.S.C. 154(b) by 0 days.

This patent is subject to a terminal disclaimer.

(21) Appl. No.: 09/293,973

(22) Filed: Apr. 19, 1999

(51) Int. Cl.[7] .................................. H01L 21/8242
(52) U.S. Cl. ................ 438/253; 438/254; 438/396; 438/397; 438/239; 257/306; 257/296
(58) Field of Search .............................. 438/253, 254, 438/396, 397, 239; 257/306, 296

(56) References Cited

U.S. PATENT DOCUMENTS

| | | | | |
|---|---|---|---|---|
| 5,061,650 A | * | 10/1991 | Dennison et al. | 438/253 |
| 5,332,685 A | | 7/1994 | Park et al. | 438/107 |
| 5,622,883 A | * | 4/1997 | Kim | 438/396 |
| 5,686,337 A | * | 11/1997 | Koh et al. | 438/240 |
| 5,780,339 A | | 7/1998 | Liu et al. | 438/253 |
| 5,786,250 A | * | 7/1998 | Wu et al. | 438/254 |
| 5,895,239 A | * | 4/1999 | Jeng et al. | 438/239 |
| 5,916,823 A | * | 6/1999 | Lou et al. | 438/738 |
| 5,994,730 A | * | 11/1999 | Shrivastava et al. | 257/306 |
| 6,015,734 A | * | 1/2000 | Huang et al. | 438/253 |
| 6,022,776 A | * | 2/2000 | Lien et al. | 438/253 |
| 6,037,213 A | * | 3/2000 | Shih et al. | 438/253 |
| 6,077,743 A | * | 6/2000 | Chen | 438/255 |
| 6,096,595 A | * | 8/2000 | Huang | 438/238 |
| 6,100,129 A | * | 8/2000 | Tu et al. | 438/238 |
| 6,100,138 A | * | 8/2000 | Tu | 438/253 |
| 6,107,155 A | * | 8/2000 | Hsiao et al. | 438/397 |
| 6,121,082 A | * | 9/2000 | Linliu et al. | 438/253 |
| 6,285,053 B1 | * | 9/2001 | Park | 257/306 |

FOREIGN PATENT DOCUMENTS

EP 0 840 371 A2 * 6/1998 ....... H01L/21/8242

OTHER PUBLICATIONS (1) H.K. Kang et al., "Highly Manufacturable Process Technology for Reliable 256 Mbit and 1 Gbit DRAMS", p. 635, IEDM'94.

* cited by examiner

Primary Examiner—Eddie Lee
Assistant Examiner—Jos″ G. Diaz

(57) ABSTRACT

A DRAM capacitor and a method for fabricating the same are disclosed. The method sequentially formed word lines, landing pads, first interpoly dielectric (IPD1) layer, bit line, and IPD2 layer, and then in terms of line masks, nitride cap nitride spacer and landing pad to serve as etching mask or stopping layer, and avoid the usage of a mask layer of storage node contact. Furthermore, the invention fully utilizes the etching selectively between IPD2 (BPSG) layer and IPD1 layer (densified TEOS) by an anhydrous HF to expand the space in an etched IPD2 layer to increase the capacitor area.

16 Claims, 12 Drawing Sheets

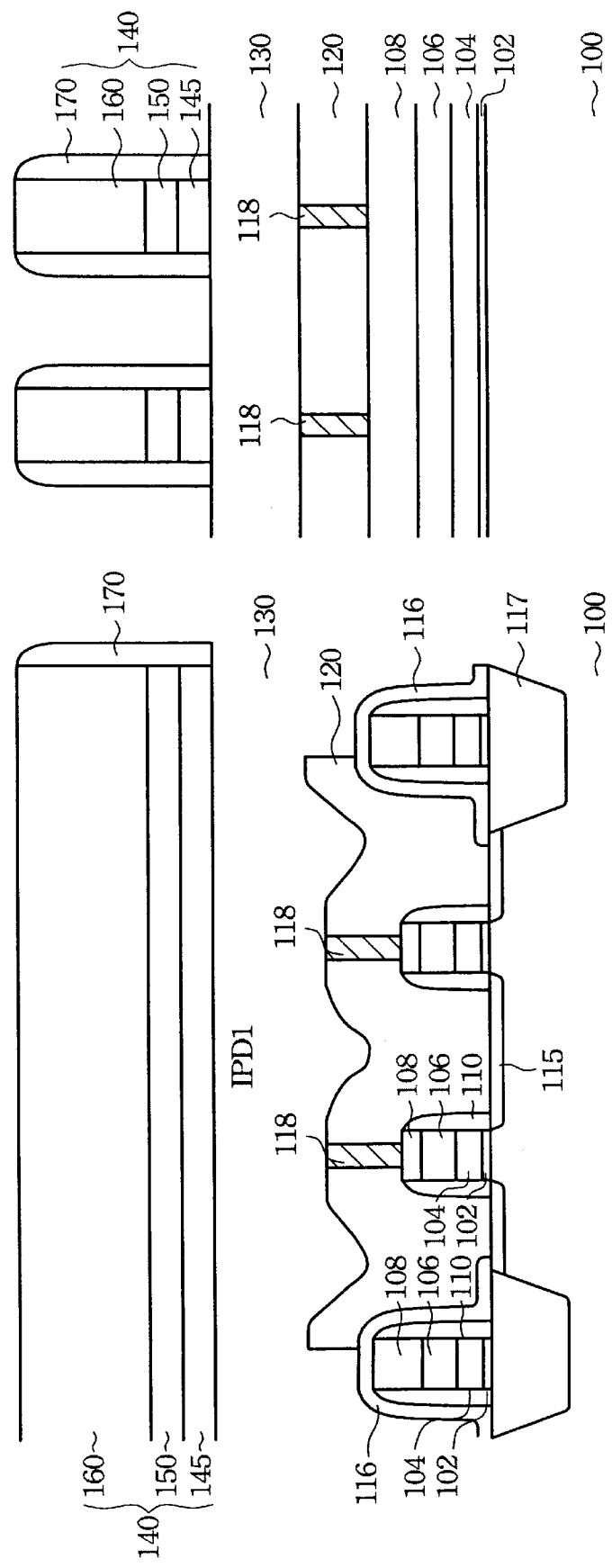

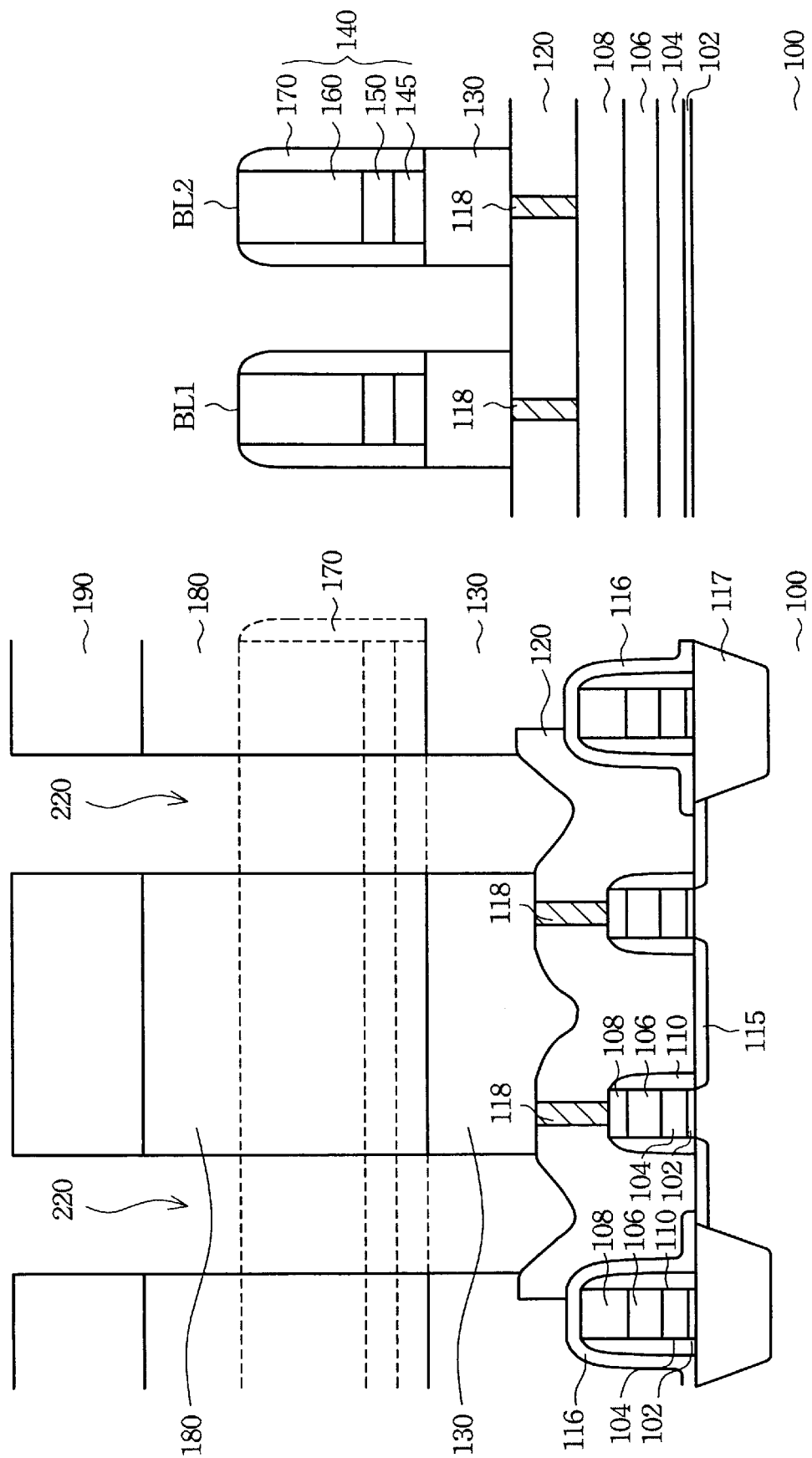

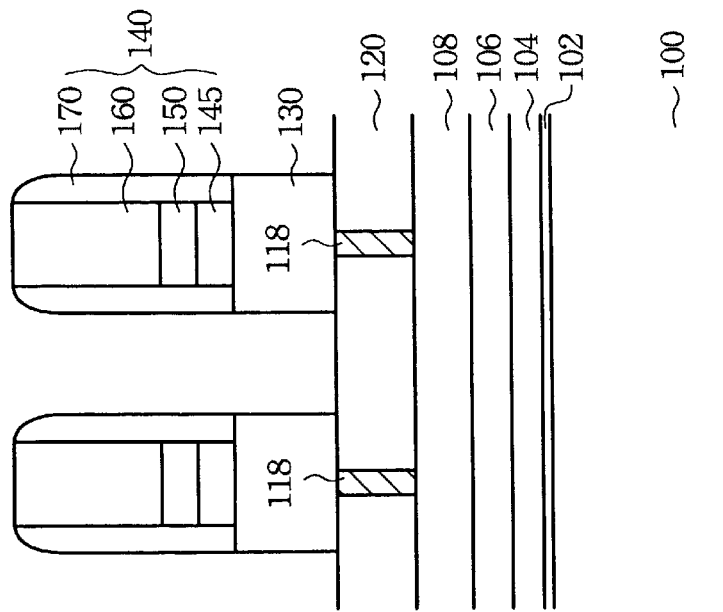
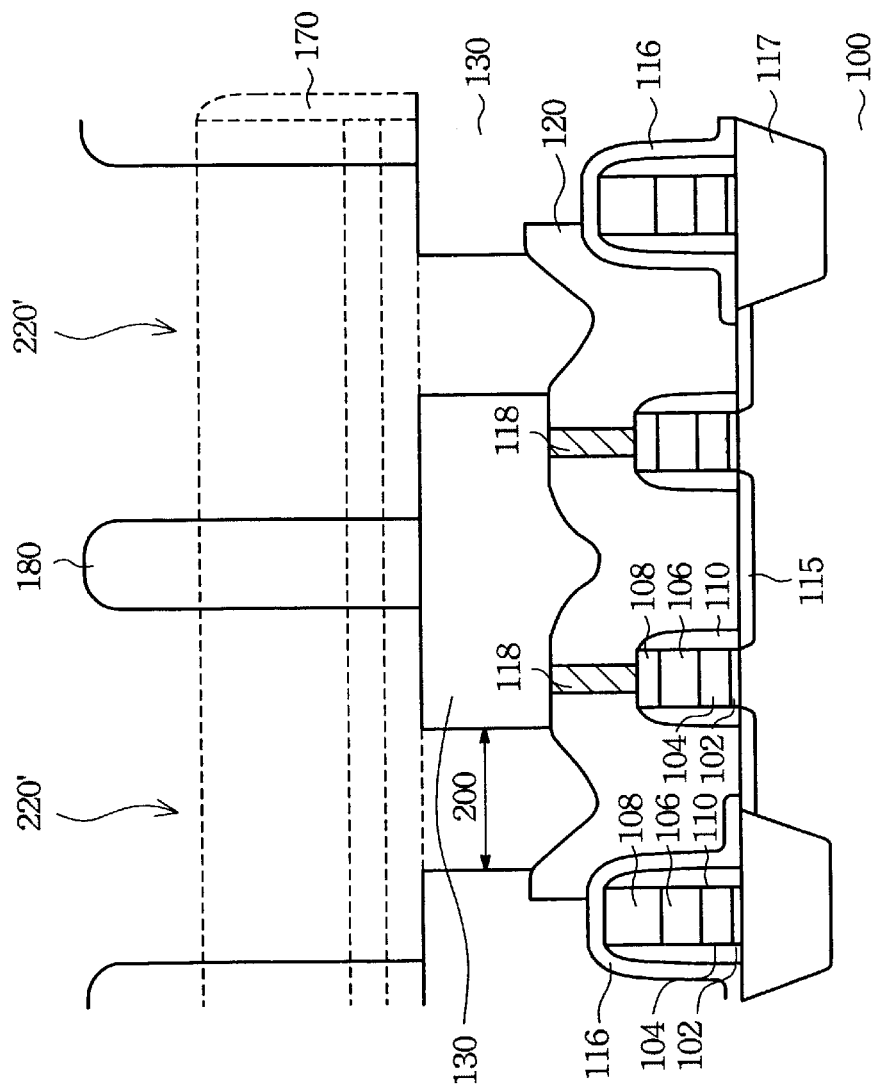
Fig.6B
Fig.6A

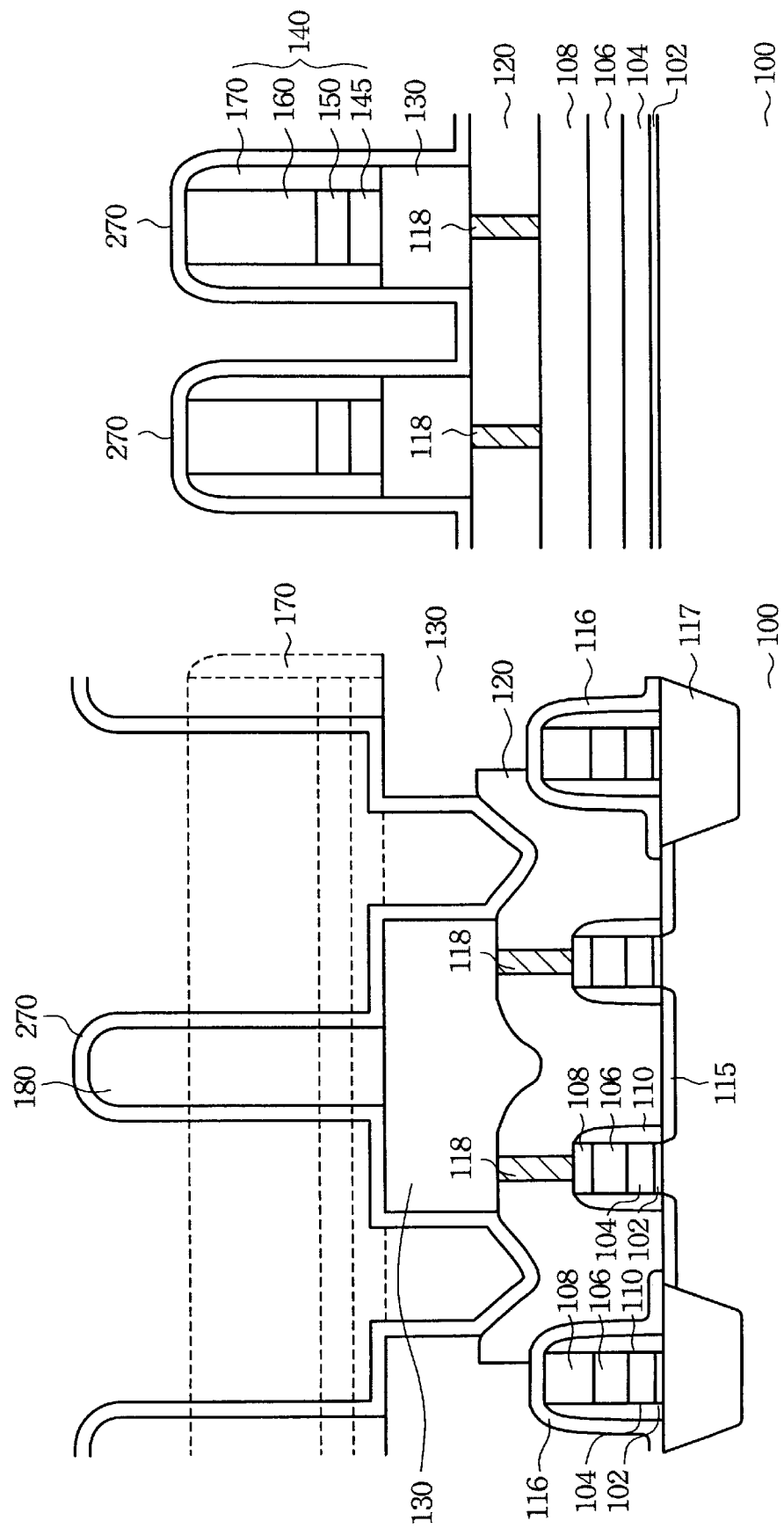

DRAM CAPACITOR AND A METHOD OF FABRICATING THE SAME

FIELD OF THE INVENTION

The present invention relates to a semiconductor memory process, and more specifically, to a DRAM capacitor and a method of fabricating the same.

BACKGROUND OF THE INVENTION

The computer and the electronic industry demand of increasing its whole speed performance as well as it's cost down for fabricating integrated circuits. As far as a computer is concern, Doubtlessly, the DRAM integrated circuits play a crucial role for a computer is concerned. A great number of DRAM memory cells are usually required, and thus they play a vital factor for determining the I/O speed of the computer. Hence, pursuing the miniaturization of the DRAM device so as to down the cost as well as high-speed performance are almost the ultimate goals.

No matter to miniaturize the device or to pursue the high-speed performance, the DRAM cell's storage capacity is a major factor that needs to be considered. The capacitor is formed with a storage node, a cell plate, and an intervening dielectric layer. Thus the storage capacity could be increased by making the capacitor dielectric thinner, by using an insulator with a larger dielectric constant, or by increasing the area of the capacitor. The first two options are not viable, since capacitor dielectrics thinner than those now being used in DRAM cells will suffer leakage due to Fowler-Nordheim tunneling. The suffering from a higher leakage for using a larger dielectric constant insulator is also reported in some research. Thus, for one-transistor DRAM, a large surface area of the storage node and cell plate are necessary in order to provide high capacitance and therefore optimal performance of the capacitor. However, a large surface area of the storage node and cell plate conflicts with the shrinkage of the feature size of the DRAM.

Balanced against this need is the competing requirement that the capacitor also occupy a minimum of space on the semiconductor substrate on which the capacitor is formed. One manner in which the semiconductor industry has approached minimal space capacitor formation is to form the capacitor at a significant distance above the semiconductor substrate. When so doing, the storage node and the cell plate are typically wrapped around the other, forming what is known as a stacked capacitor.

However, by using a conventional method, the aspect ratio of the contact hole for forming such a stacked capacitor, tends to gradually increase in accordance with the use of three dimensional capacitor structures in the vertical direction. The decrease of the contact-hole diameter and its high aspect ratio impose a large burden on succeeding photolithography steps. If the photolithography is carried out without accurate alignment, the contact hole cannot be formed at a desired site. Also, in the case of a high aspect ratio, it is likely that the etching process of the contact hole will cease before the interlayer insulation film is entirely removed.

A method of forming a contact plug has been proposed to reduce difficulties due to the high aspect ratio of contact holes in storage electrodes. See U.S. Pat. No. 5,332,685, entitled "Method of Manufacturing a DRAM Cell," to Park et al. Recently, Samsung had proposed using the concept of 'landing pad' which has greatly improved the art. See IEDM'94, p635, Kang et al., "Highly Manufacturable Process Technology for Reliable 256 Mbit and 1 Gbit DRAMs." This method increases several mask steps required for fabrication, thereby increasing process complexity. Another improving method is proposed by Liu et al., in U.S. Pat. No. 5,780,339, entitled "Method for fabricating a semiconductor memory cell in a DRAM." Liu utilizes an inter plug technique and nitride sidewall spacers 30 to improve deep node contact etching damage and reduce the number of mask steps for typical landing pad processes. Thus, Liu's method allows the manufacture of a semiconductor memory cell that reduces the difficulties due to the high aspect ratio of the contact hole of a storage node. See FIG. 1.

However, to fabricate a DRAM capacitor in Liu's method, two mask layers are still required for forming the storage node contact and storage node. In addition, didn't fully utilize the two dielectric layers 22 and 28, and thus the issue of the topology height still exist for making large area of capacitor.

Consequently, an improved method is needed to overcome the above-discussed problems.

SUMMARY OF THE INVENTION

An object of the invention provides a method for fabricating a DRAM cell. The invention use bit line, nitride cap, nitride spacer and landing pad to avoid the usage of mask layer of storage node contact and to fully utilize space of IPD1 and IPD2. Furthermore, the mask layer of storage node becomes non-critical.

The other object of the invention is to reduce the topographic height for a DRAM cell.

The method comprises following steps: at first, provide a semiconductor upon which words lines, isolation regions, word line spacers, source/drain regions, word line nitride caps are formed. After that, a self-aligned contact method is used to form slim isolation regions on the tops of word lines so as to define the openings for forming landing pads. The landing pads are to use for storage nodes and bit line contact. A first interpoly dielectric (IPD 1) is then formed on all regions. Then, after bit lines are formed, a nitride cap and a nitride spacer formations are sequentially formed on the tops and the sidewalls of the bit lines.

Subsequently, a second interpoly dielectric layer (IPD 2) is formed. The IPD1 and IPD2 in the invention need to carefully select so that the IDP 2 layer has a substantially higher etching rate than that of IPD1 in a condition that the etchant is properly chosen. Next, line masks is formed on the IPD2 to define the storage nodes. Each line mask is properly disposed so that the open space between two line-masks is in width smaller than the landing pad. A dry etching is then performed to expose portions of the landing pads by etching through the IPD2 and IPD1 using the line masks, the nitride cap, nitride spacers as masks. After tripping the line masks, an isotropic etching to expand the upper portion of recessed regions is achieved. To achieve the goal, in an embodiment, the IPD 2 is formed of BPSG and the IPD1 is made of densified TEOS. The ratio of etching rate for IPD2 (BPSG) to IPD1 (densified TEOS) is about 100:1 to 300:1 by using an etchant such as an anhydrous vapor HF.

After that, an first in-situ doped (ISD1) polysilicon is formed to serve as the capacitor storage node. A photoresist then refill the remnant portions of recessed regions. CMP process is then to planar surface by removing portions of the ISD polysilicon and IPD2 layer using the nitride cap as a stopping layer. Finally, after the photoresist is stripped, a conformal thinner insulating layer and another ISD polysilicon is sequentially formed on the ISD1 polysilicon.

BRIEF DESCRIPTION OF THE DRAWINGS

The foregoing aspects and many of the attendant advantages of this invention will become more readily appreciated as the same becomes better understood by referring to the following detailed description, when taken in conjunction with the accompanying drawings, wherein:

FIG. 3A is a cross-sectional view of forming a bit line on a IPD1 layer, views along a bit line in accordance with the present invention;

FIG. 3B is a cross-sectional view of forming a bit line on a IPD1 layer, views along a word line in accordance with the present invention;

FIG. 5A is a cross-sectional view, after an etching through IPD2 and IPD1 to form recessed region is achieved, views along a line b–b' in FIG. 4C in accordance with the present invention;

FIG. 5B is a cross-sectional view after an etching through IPD2 and IPD1 to form recessed region is achieved, views along a line a–a' in FIG. 4C in accordance with the present invention;

FIG. 6A is a cross-sectional view, after removing portions of the IPD2 so as to expand the recessed regions by isotropic etching is achieved, views along views along a line b–b' in FIG. 6C in accordance with the present invention;

FIG. 6B is a cross-sectional view of forming line masks on IPD2 and then patterning to form recessed region, views along a line a–a' in FIG. 6C in accordance with the present invention;

FIG. 7A is a cross-sectional view of in-situ doped polysilicon is deposited, views along a line b–b' in FIG. 6C in accordance with the present invention;

FIG. 7B is a cross-sectional view of in-situ doped (ISD) polysilicon to form storage nodes, views along a line a–a' in FIG. 6C in accordance with the present invention;

DETAILED DESCRIPTION OF THE PREFERRED EMBODIMENT

As forgoing depicted in the background of invention, the storage nodes and storage node contacts are critical lithographic layers, in addition, for increasing the area of a capacitor, it demands to increase the capacitor height, leading to the difficulty in metal contact process, such as the lithography and etching technology. The present provides a method to resolve above issues.

Figure 1:
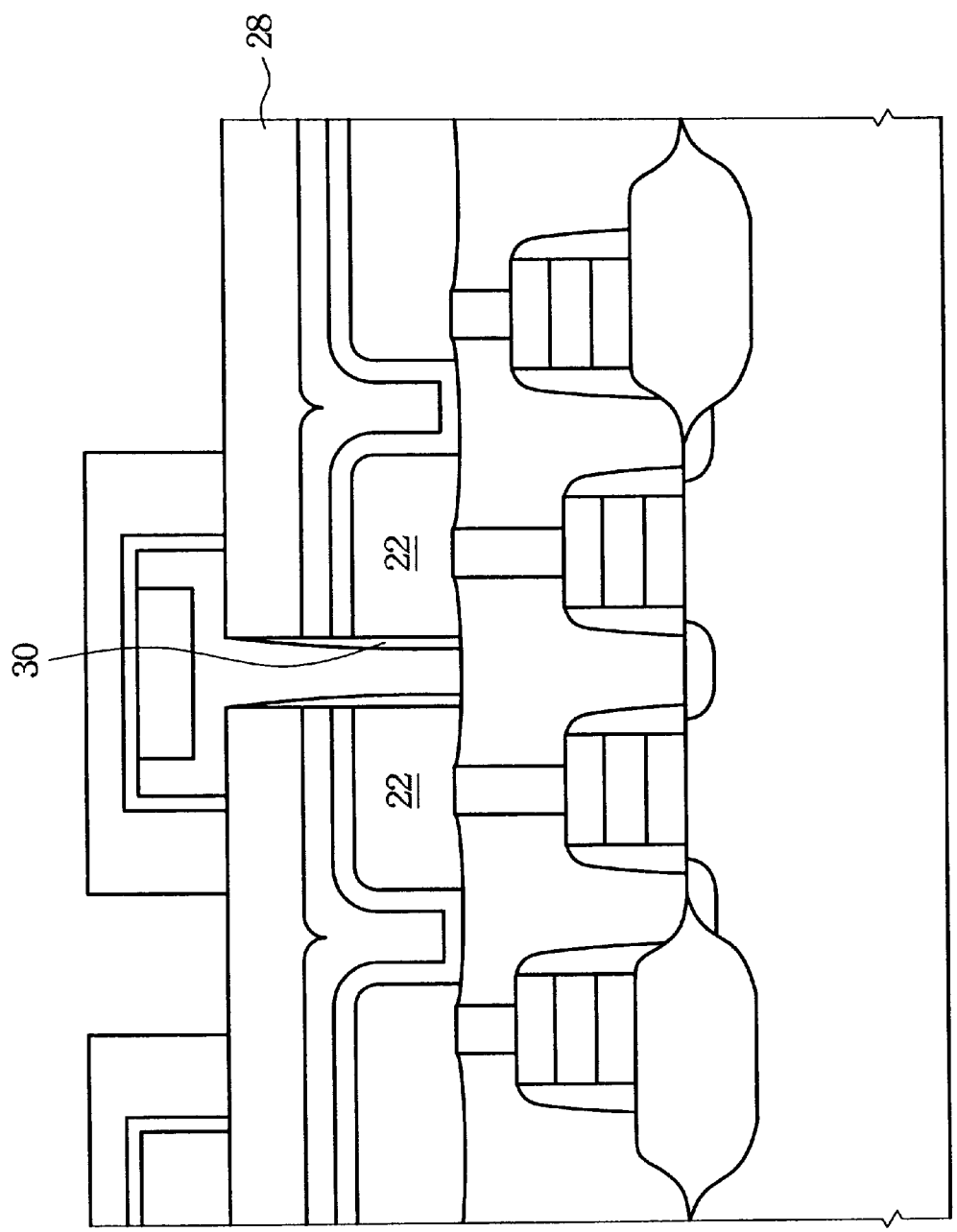
FIG. 1 is a cross-sectional view of a DRAM cell in accordance with the prior art.
Figure 2A:
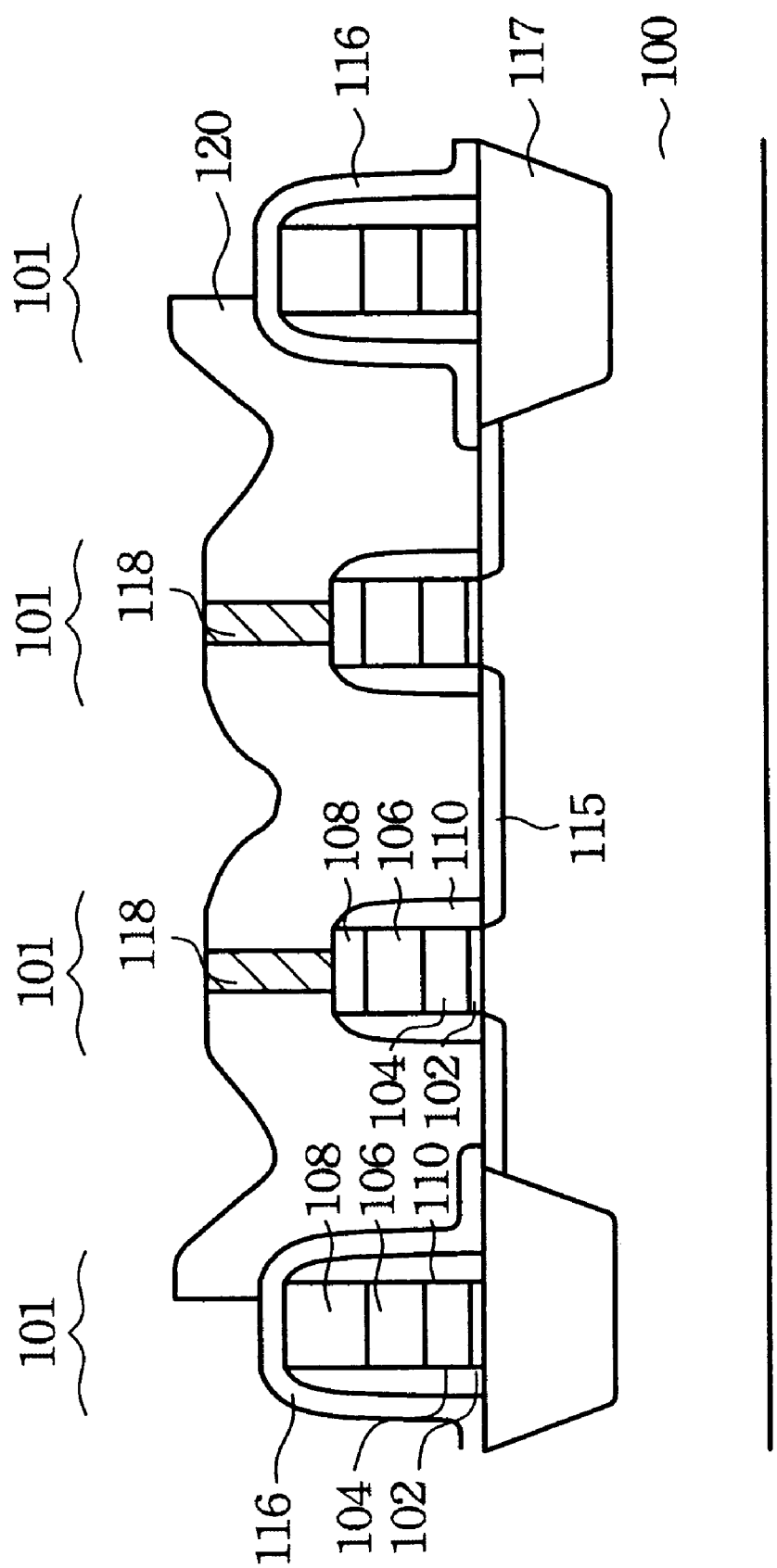
FIG. 2A is a cross-sectional view of forming landing pads on word lines, source/drain regions in accordance with the present invention.
Figure 2B:
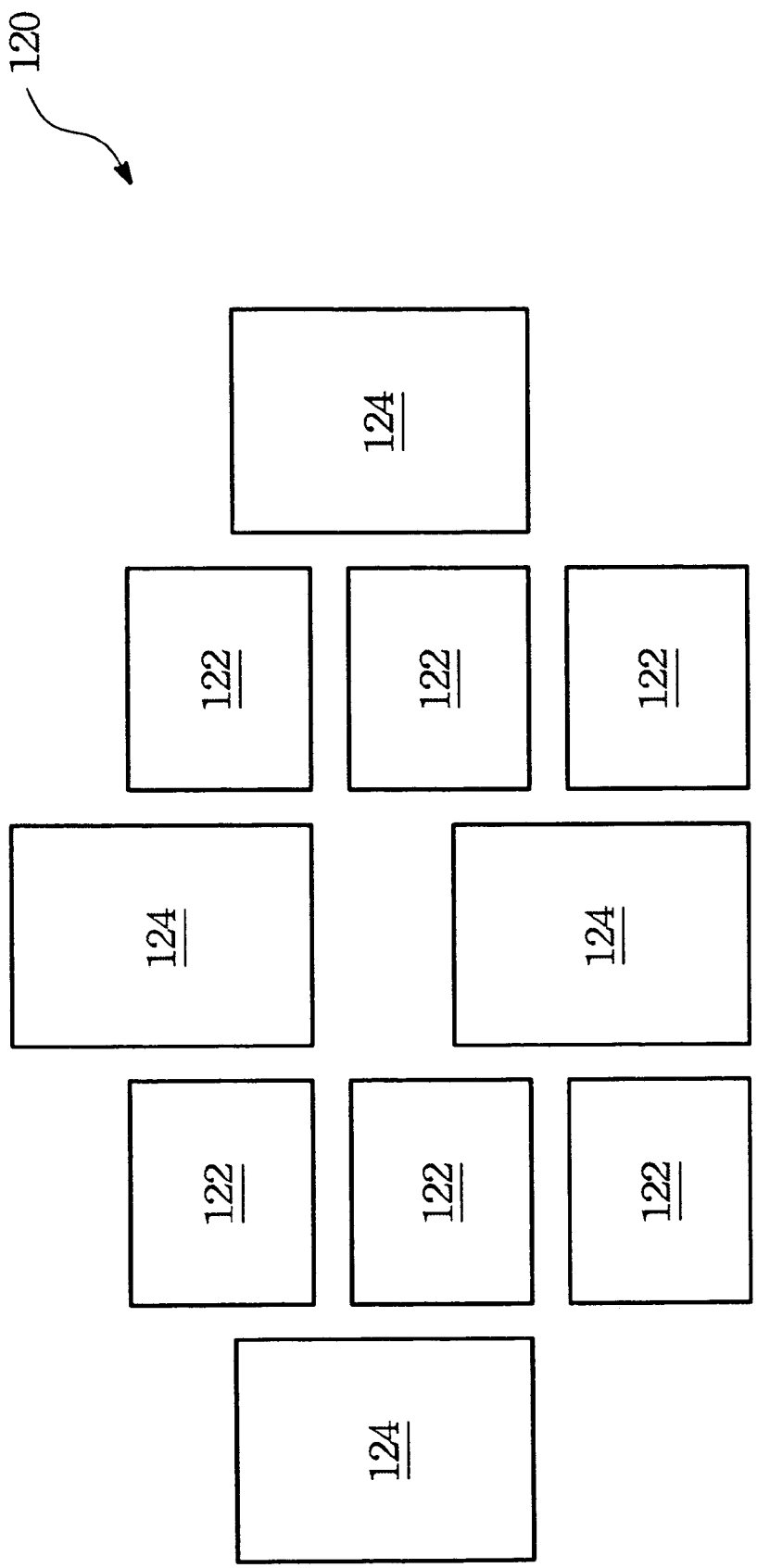
FIG. 2B is a layout of landing pad in accordance with the present invention.

Referring to FIG. 2A, a semiconductor substrate 100 is provided upon which a plurality of stack-gates 101, source/drain regions 115, landing pads 120 and isolation regions 117 are formed by a conventional method. The stack gates 101 serve as word-lines and provide control signals to the memory cell. Each stack gate 101 comprises a gate oxide layer 102, a polysilicon layer 104, a metal silicide 106 and a nitride capping layer 108 that sequentially formed on the semiconductor substrate 100. The semiconductor substrate 100 is preferably a silicon wafer, however, any suitable type of semiconductor substrate may be used such as silicon on insulator (SOI), silicon on sapphire (SOS) and the like. Each stack gate 101 is provided at the sidewall thereof with a protective spacer 110. The spacer 110 is preferably composed of silicon dioxide or silicon nitride. A dielectric layer 116 composed of a LPTEOS or a HDP (high-density plasma) oxide is formed over the periphery transistors. In the depicted embodiment, the protective spacers 110 are silicon nitride spacers. The isolation region 117 can be either formed as a trench-isolation or a FOX-isolation in accordance with the process requirement. For connecting the bit lines and the source/drain regions, the landing pads 120 are formed by using a conventional self-aligned contact (SAC) method. For example, forming a thick dielectric layer 118 composed of TEOS on all regions, and then patterning the dielectric layer 118 to expose a portion of source/drain regions 115 in order to form contact holes. After that, using isotropic and selective wet etching to expand the contact holes so as to define the openings for landing pads (or say landing plug). The selective etching process has a selectivity ratio of about 20:1 for oxide to nitride. The synoptic layout of the landing pads is shown in FIG. 2B, includes landing pads 120 for bit line contacts 124 and storage nodes 122. In a preferred embodiment, for 0.25 µm feature size of DRAM, the sizes of landing pad for storage node is about 0.5×0.48 µm, respectively, along the word line and bit line. In addition, the spacing between two adjoin landing pads is about 0.1–0.2 µm generally. An another conventional method of fabricating the landing pad 120 is to form a conducting layer on the stack gates 101, source/drain regions 115, and the isolation regions 117 firstly, and then a mask pattern followed by an etch step are implemented to pattern the conducting layer as landing pads 120.

Subsequently, a conductive material filled all regions, and then an etching back is implemented to form landing pads 120; the results are shown in FIGS. 2A–2B. The landing pad 120 is composed of a material such as tungsten, titanium, titanium silicide, or polysilicon. In the depicted embodiment, the layer of conductive material comprises polysilicon, and is deposited by a chemical vapor deposition.

After that, a blanket refilled process using first inter-poly dielectric-layer (herein and after called IPD 1) 130 in the resulting topographic structures is done. See FIG. 3A. For obtaining better surface coverage, a densify dielectric layer which has a highly selective etching ratio comparing to the IPD2 layer is selected. Preferably, the material is a LPTEOS (low pressure tetraethyl orthosilicate), PETEOS (plasma enhanced TEOS) or an ozone TEOS layer. Typically, the IPD1 is about 200–400 nm in thickness.

Still referring to FIG. 3A, an optional etching back or CMP process is performed to obtain a smooth topography for forming bit lines 140. The bit lines 140 are deposited on the IPDI 130. The bit lines 140 are made up of two-conductive layer, a polysilicon layer 145 and a tungsten silicide layer 150. Then, a thick nitride layer 160 (e.g. silicon nitride) of about 200–600 nm in thickness as a protective capping layer is formed on the top surface of the two-conductive layer. The resulting nitride capping layer 160/two-conductive layer 145, 150 structure is then being patterned to be as bit lines. A next sidewall nitride spacer 170 of about 50–100 nm in thickness for protecting the bit lines is then formed. FIG. 3B shows a result of cross-sectional structure from a line a–a' in FIG. 4C, a top view.

A gap refill between bit line with an IPD2 layer, a second insulting layer 180, is implemented. In a preferred embodiment, for obtaining a substantially higher etching rate over aforementioned IPD1, the IPD2 is a BPSG (borophosphorus silica glass) layer or a phosphosilicate glass (PSG) layer having a thickness of about 400–600 nm. Shown in FIGS. 4A–4B are cross-sectional views, herein the FIG. 4A and FIG. 4B are views along a bit line and a word line, respectively.

Figures 4A, 4B:
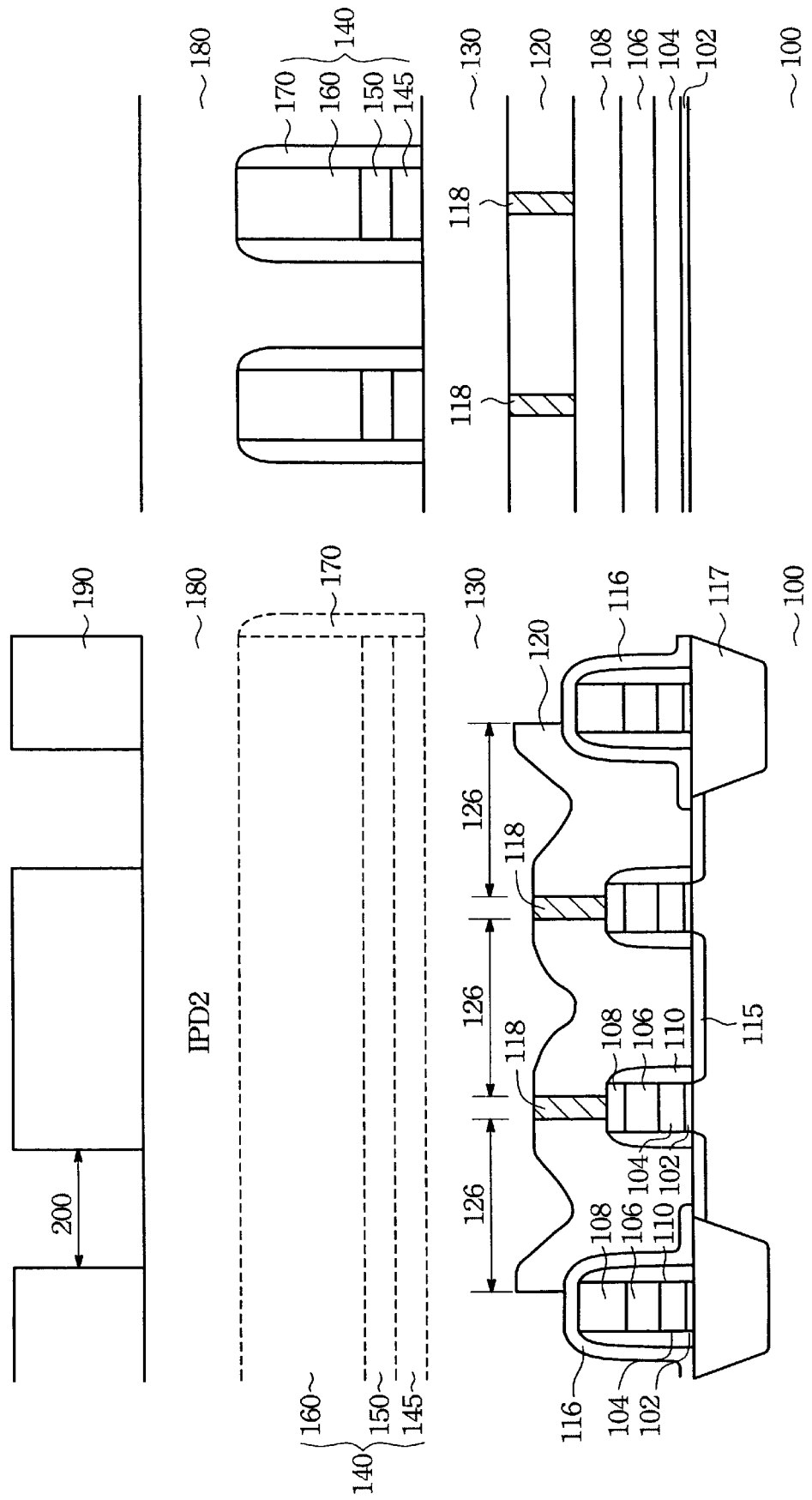
FIG. 4A is a cross-sectional view of forming IPD2 on all areas, views along a bit line in accordance with the present invention.
FIG. 4B is a cross-sectional view of forming IPD2 on all areas, views along a word line in accordance with the present invention.
Figure 4C:
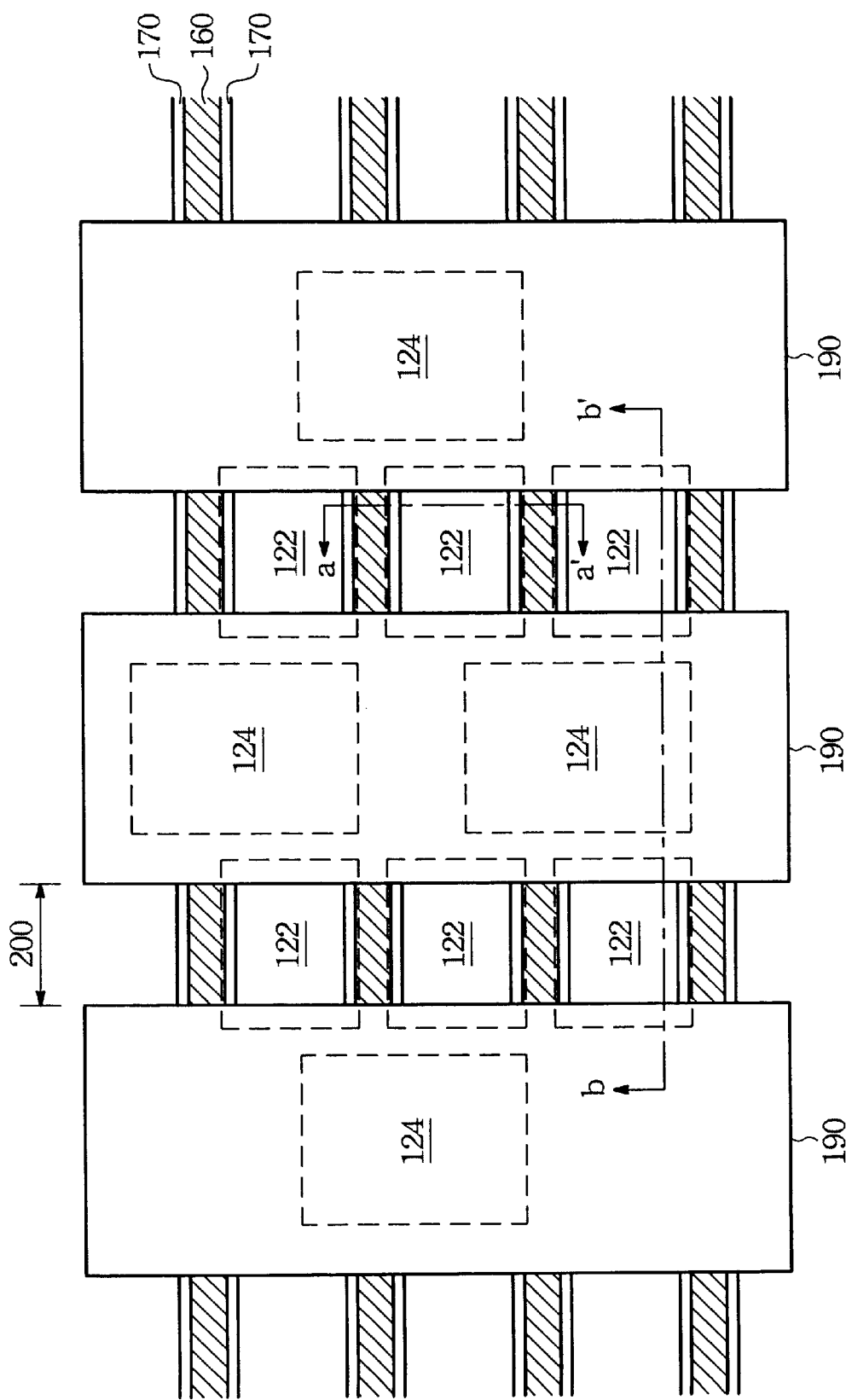
FIG. 4C is a top view of forming line masks on IPD2 in accordance with the present invention.

Still referring FIGS. 4A–4C, line masks 190 composed of a photoresist is formed on the IPD2 180. Each of the line-masks 190 is perpendicular to the bit lines 140 so as to pattern the storage node. The distance between two line-masks 200 (or called line opening) needs to be smaller than the lading pad width 126 by about 0.05–0.1 $\mu$m, so as to accommodate the misalignment. For example, for a 0.25 nm feature size of DRAM, the intervals of line opening 200 and of the photoresist mask region 190 are about 0.35–0.5 $\mu$m and 0.55–0.8 $\mu$m, respectively. Therefore, the formation of such photoresist pattern is not critical. After that, a self-aligned contact (SAC) process, a dry etch through IPD2 180 and IPD1 130 using the landing pads 120 as stopping layers is done to form a plurality of opening regions 220. During the etching process, the bit-line nitride spacers 170 serve as a hard mask to prevent the storage node exceeding the landing pad along a word line direction, please refer to FIG. 5A and FIG. 5B, which are cross-sectional views along the line b–b' and the line a–a' in FIG. 4C, respectively. Note that in figures here through FIG. 8, the dot-lines represent the layered structure lying at the backside of a nitride spacer 170 or an IPD2 layer. Since the storage node is directly formed on a landing pad 120, the storage node contact mask is thus reduced.

Figure 6C:
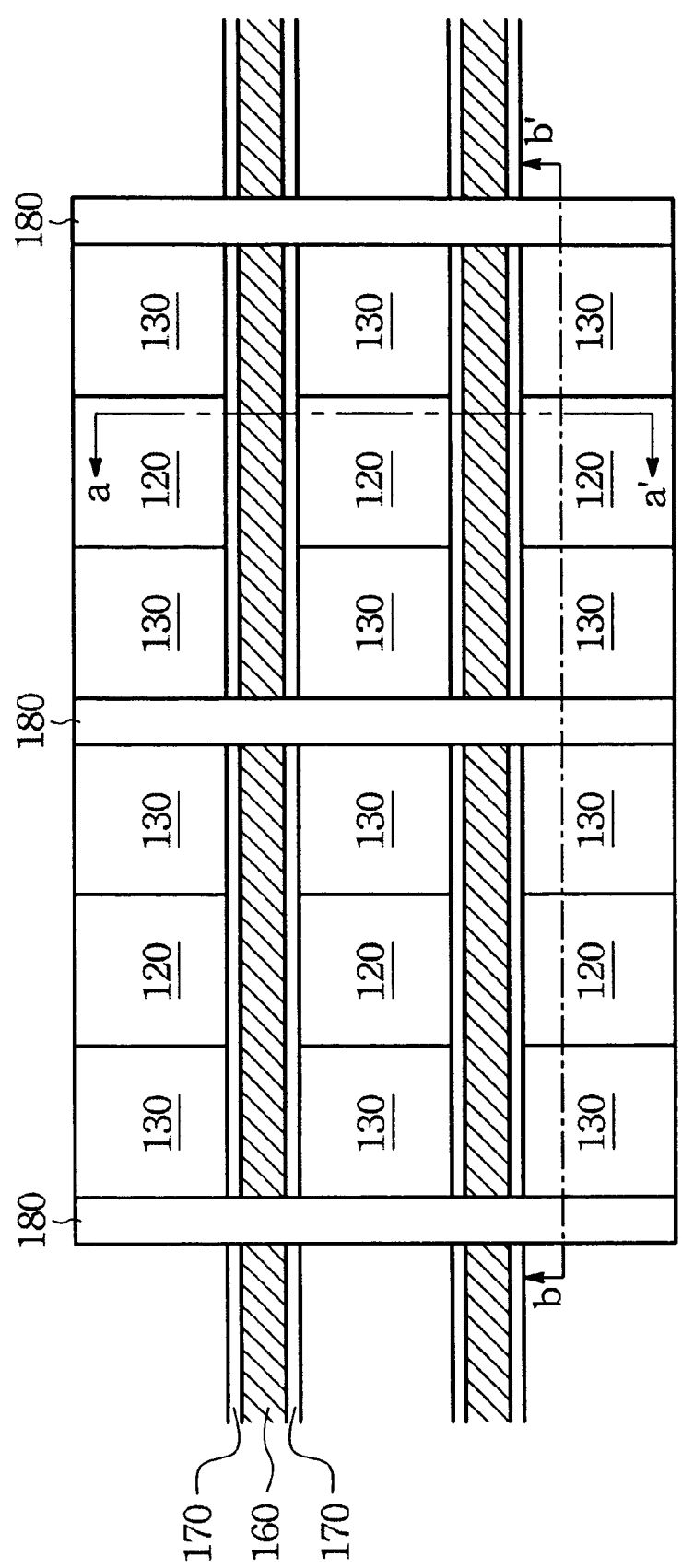
FIG. 6C is a top view, after removing portions of the IPD2 so as to expand the recessed regions by isotropic etching is achieved, in accordance with the present invention.

Referring to FIG. 6A, after the photoresist layer 190 is stripped, an isotropic etching by anhydrous vapor HF is performed to expand the plurality of opening regions 220 to form opening regions 220'. Noted that the highly etching selectivity for BPSG layer over densified the TEOS layer (of about 100:1 to 300:1) by vapor anhydrous HF is found, and thus the etching is isotropic. The IPD1 layer will not be substantially affect while the storage node size along the bit line direction is etched and expanded to about 200–300 nm per side. This can avoid shorting to another landing pads for bit line contact. FIG. 6B shows the storage node size along word line will also not be expanded due to the presence of the bit-line nitride capping layer and nitride spacer. FIG. 6C is a top view.

Turning to FIGS. 7A–7B, a conductive layer 270 serves as a bottom electrode of the storage nodes is formed on the resulting structure. Preferably, the conducing layer is a first in-situ doped (ISD) polysilicon layer of about 40–70 nm or an equivalent layer such as hemispherical grained (HSG) polysilicon in order to increase the plate areas of the capacitor.

Figure 8:
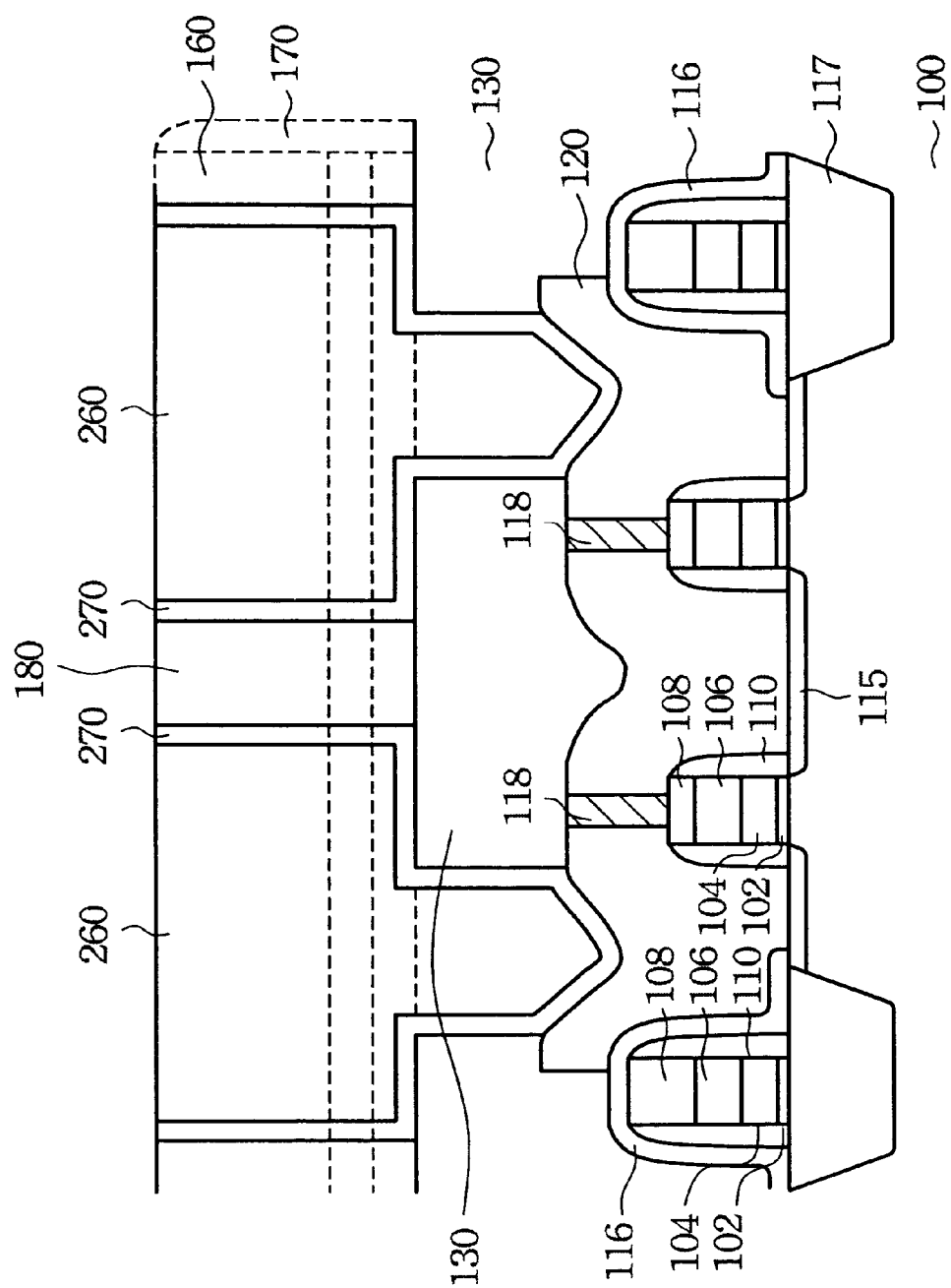
FIG. 8 is a cross-sectional view of forming a photoresist layer on ISD polysilicon and then processing a CMP to isolate each storage node, in accordance with the present invention.
Figure 9:
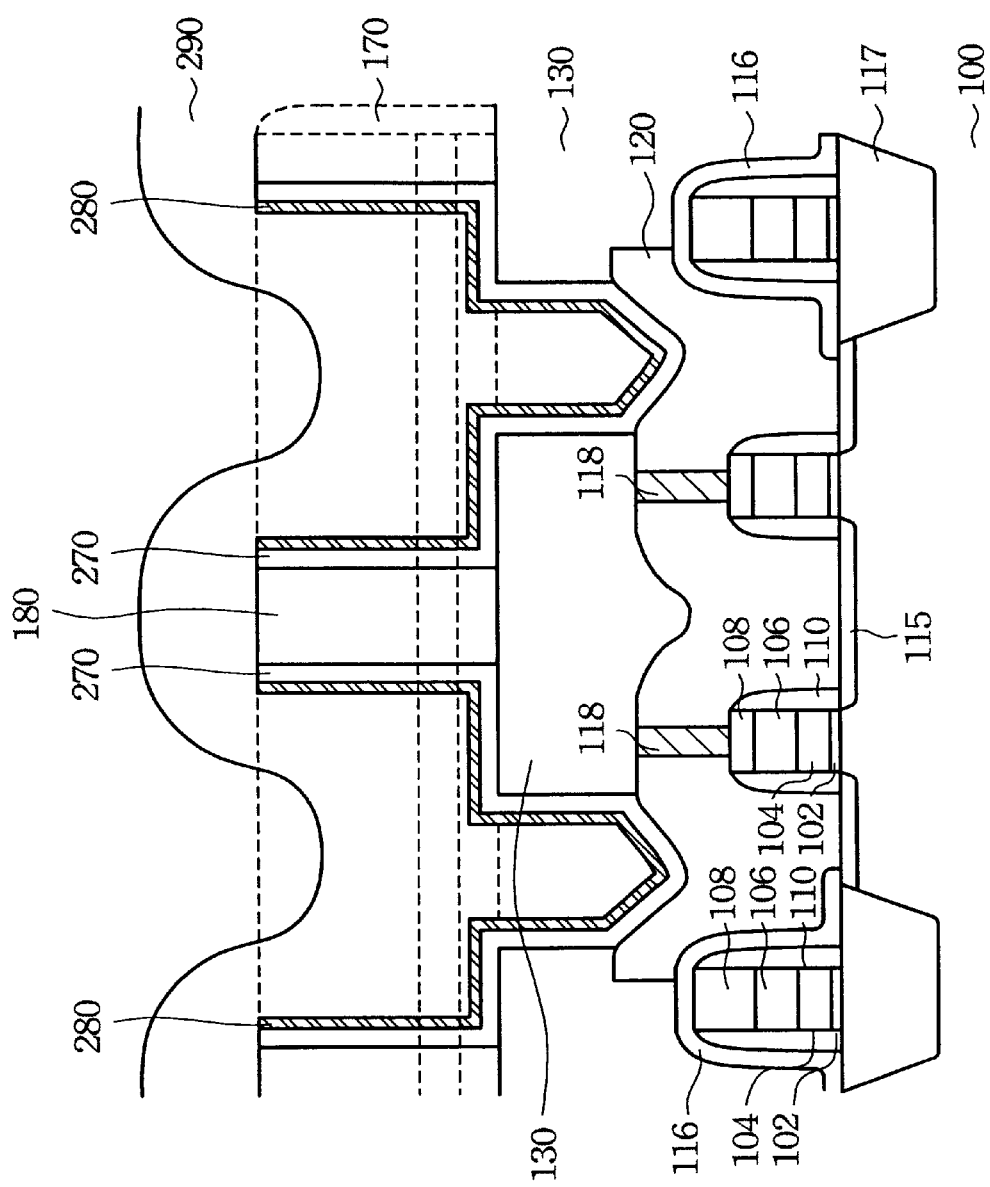
FIG. 9 is a cross-sectional view of forming an intervening isolation layer and a cell plate sequentially on the in-situ doped (ISD) polysilicon layer, in accordance with the present invention.

Referring to FIG. 8, after a photoresist layer 260 refilled the opening regions 220' is achieved, a CMP process is done to completely remove a portion of the photoresist layer and the conducting layer where such layers are on the top of IPD2 and nitride capping layer 160. A portion of the IPD2 is also removed to obtain the same topographic height as the nitride capping layer 160. The photoresist layer is acts as a protecting layer 260 and is then stripped away by a conventional method. Referring to FIG. 9, for forming DRAM capacitors completely, a thin-dielectric conformal layer 280 is formed of about 5–10 nm on the first ISD polysilicon layer, and then a second electrically conductive material, such as another ISD polysilicon layer 290 is then sequentially filled in and deposited. In a preferred embodiment, the thin-dielectric layer 280 is prepared by PECVD, including $Ta_2O_5$, $TiO_2$, $LiNbO_3$ and PLZT (lead lanthanum zirconate titanate), or fabricated by LPCVD, including a stack ONO (oxide/nitride/oxide) structure. The dot-lines here represent the bit line layered structure lying at the backside of a ISD polysilicon layer 290 or an IPD2 layer 180.

The invention provides a method to fabricate DRAM capacitor and has following benefits:

(1) The process uses the bit line nitride cap, nitride spacer and landing pad as etching stopped layers, so the storage node can be directly formed on the landing pad, a mask count for fabricating storage node contact is thus reduced.

(2) The space of IPD1 and IPD2 layer as well as the lading pad is being fully utilizes for forming storage nodes, and thus reduces the topographic height.

(3) The storage node mask becomes a non-critical process.

As is understood by a person skilled in the art, the foregoing preferred embodiment of the present invention is an illustration of the present invention rather than limitation thereon. It is intended to cover various modifications and similar arrangements included within the spirit and scope of the appended claims, the scope of which should be accorded the broadest interpretation so as to encompass all such modifications and similar structure.

What is claimed is:

1. A method for fabricating a capacitor in a DRAM cell, said method comprising the steps of:

providing a semiconductor substrate, which is formed therein with isolation regions, source/drain regions, and word lines having first spacers and first capping layers on tops of said word lines;

forming landing pads on said source/drain regions, said first spacers, said first capping layers of said word lines, each one of said landing pads being separated by an isolating layer, said isolating layer being on a portion of said first capping layers;

forming a first dielectric layer on said landing pads and said isolating layer;

forming bit lines on said first dielectric layer, each said bit line having a second capping layer on a top and second spacers on sidewalls;

forming a second dielectric layer on resulting surfaces, said second dielectric layer having a substantial higher etching rate than to that of said first dielectric layer by at least one etchant;

patterning said second dielectric layer through first dielectric layer to expose portions of said landing pads using line masks, said second capping layer and said second spacers as etching masks, each of said line masks being substantially perpendicular to said bit lines and a space interval between any two said line masks which are adjoin, having a smaller width than each said landing pad, so that said space interval is within said landing pads;

etching portions of said second dielectric layer to expand openings of said second dielectric layer using an etchant having a substantially higher etching rate to said second dielectric layer than to said first dielectric layer;

forming a capacitor storage node of said DRAM cell on resulting regions;

refilled a photoresist layer on all recessed region;

performing a planarization process using said second nitride capping layer as a stopping layer; and removing said photoresist layer.

2. The method of claim 1, wherein said first dielectric layer is formed of a material of about 200–400 nm in thickness, and selected from the group consisting of a LPTEOS, a PETEOS and an ozone TEOS layer.

3. The method of claim 1, wherein said second dielectric layer is formed of a BPSG layer or a PSG layer of about 400–600 nm in thickness.

4. The method of claim 1, wherein said etchant comprises an anhydrous vapor HF.

5. The method of claim 1, wherein said line masks is a photoresist pattern and said space interval is about 0.35–0.5 µm in width along said bit lines.

6. The method of claim 1, wherein said step of forming a capacitor storage node is to deposited an in-situ polysilicon layer of about 40–70 nm in thickness.

7. The method of claim 1, wherein said exposed landing pads is to serve as storage node contact.

8. The method of claim 1, after the step of removing said photoresist layer, further comprising forming a capacitor dielectric layer on said capacitor storage nodes; and forming a capacitor top plate of said DRAM cell on said capacitor dielectric layer.

9. A method for fabricating a capacitor in a DRAM cell, said method comprising the steps of:

providing a semiconductor substrate, which is formed therein with isolation regions, source/drain regions, and word lines which are with first nitride spacers and first capping layers on tops of said word lines;

forming a plurality of oxide layers, each plurality of said oxide layers being formed on each of said first capping layers;

forming a conductive layer on all regions;

patterning said conductive layer to form landing pads for serving as storage node contact, each one of said landing pads being separated by said oxide layer;

forming a first dielectric layer on said landing pads and said oxide layers;

forming bit lines on said first dielectric layer, each said bit line having a second nitride capping layer on a top and second nitride spacers on sidewalls;

forming a second dielectric layer on resulting surfaces, said second dielectric layer having a substantial higher etching rate than to that of said first dielectric layer by at least one etchant;

forming line masks on said second dielectric layer, each of said line mask being separated by a line opening, each said line opening being perpendicular to said bit lines and having a width smaller than that of each said landing pad, so that each said line opening being aligned merely over each said lading pad;

forming recessed regions by etching through said second dielectric layer and said first dielectric layer to expose portions of said landing pads using said line masks, said second nitride capping layer, said second nitride spacers as an etching mask, stripping said line masks;

etching portions of said second dielectric layer to expand sidewalls of second dielectric layer in said recessed regions using an etchant having a substantially higher etching rate to said second dielectric layer than to said first dielectric layer;

forming a storage nodes on said resulting recessed regions;

refilled a photoresist layer on all recessed region;

performing a planarization process using said second nitride capping layer as a stopping layer;

removing said photoresist layer;

forming a capacitor dielectric layer on said storage nodes; and forming a capacitor top plate of said DRAM cell on said capacitor dielectric layer.

10. The method of claim 9, wherein said first dielectric layer is formed of a material of about 200–400 nm in thickness, and selected from the group consisting of a LPTEOS, a PETEOS and an ozone TEOS layer.

11. The method of claim 9, wherein said second dielectric layer is formed of a BPSG layer or a PSG layer of about 400–600 nm in thickness.

12. The method of claim 9, wherein said etchant comprises an anhydrous vapor HF.

13. The method of claim 9, wherein said line masks is a photoresist pattern and said line opening is about 0.35–0.5 µm in width along said bit lines.

14. The method of claim 9, wherein said step of forming a storage node is to deposited an in-situ polysilicon layer of about 40–70 nm in thickness.

15. The method of claim 9, wherein said second nitride capping layer and second nitride spacer have a thickness of about 200–600 nm and 50–100 nm in thickness.

16. The method of claim 9, wherein said exposed landing pads is to serve as storage node contact.

* * * * *